United States Patent [19]

Leupold et al.

[11] Patent Number: 4,953,555
[45] Date of Patent: Sep. 4, 1990

[54] PERMANENT MAGNET STRUCTURE FOR A NUCLEAR MAGNETIC RESONANCE IMAGER FOR MEDICAL DIAGNOSTICS

[75] Inventors: Herbert A. Leupold, Eatontown; Ernest Potenziani, II, Ocean, both of N.J.

[73] Assignee: The United States of Americas as represented by the Secretary of the Army, Washington, D.C.

[21] Appl. No.: 420,745

[22] Filed: Oct. 12, 1989

Related U.S. Application Data

[63] Continuation of Ser. No. 112,192, Oct. 20, 1987, abandoned.

[51] Int. Cl.$^5$ .............................................. A61B 5/055
[52] U.S. Cl. .................... 128/653 A; 335/304; 335/306; 324/318
[58] Field of Search ................ 128/653; 324/318, 319, 324/320; 335/299, 302, 304, 306

[56] References Cited

U.S. PATENT DOCUMENTS

| 3,205,415 | 9/1965 | Seki et al. | 335/301 |
| 3,227,931 | 7/1963 | Adler | 335/304 |
| 3,237,059 | 2/1966 | Meyerer | 335/306 |
| 4,580,098 | 4/1986 | Gluckstern et al. | 324/318 |
| 4,641,119 | 2/1987 | Moore | 324/319 |
| 4,646,045 | 2/1987 | Chari et al. | 335/301 |
| 4,646,046 | 2/1987 | Vavrek | 335/301 |
| 4,654,618 | 3/1987 | Leupold | 335/304 |
| 4,658,228 | 4/1987 | Leupold | 335/211 |
| 4,692,732 | 9/1987 | Leupold | 335/304 |
| 4,701,737 | 10/1987 | Leupold | 335/304 |

FOREIGN PATENT DOCUMENTS 0984900 3/1976 Canada ............................ 335/306

*Primary Examiner*—Ruth S. Smith
*Assistant Examiner*—John D. Zele
*Attorney, Agent, or Firm*—Michael Zelenka; Ann M. Knab

[57] ABSTRACT

A nuclear magnetic resonance device for use in diagnostic procedures on the human body is provided and comprises longitudinally extending cylindrical or rectangular crossectioned rare earths permanent magnets provided with cladding magnets extending longitudinally therewith and providing flux control for the establishment of a uniform flux field. Bucking magnets and other supplemental magnetic elements are provided to as precisely as possible control the magnetic flux field effected for the diagnostic procedures.

5 Claims, 2 Drawing Sheets

PERMANENT MAGNET STRUCTURE FOR A NUCLEAR MAGNETIC RESONANCE IMAGER FOR MEDICAL DIAGNOSTICS

The invention described herein may be manufactured, used, and licensed by or for the Government of the United States of America for governmental purposes without the payment to us of any royalties thereon.

This application is a continuation of application Ser. No. 112,192, filed 10/20/87, now abandoned.

BACKGROUND AND FIELD OF THE INVENTION

The present invention relates to the utilization of magnetic fields established by means of permanent magnets for use in medical diagnosis, particularly of the human body. Whole-body nuclear magnetic resonance diagnostics has been available in the medical arts for some time. Most or all of the currently known devices provide a field of 1.0 kOe over a working volume of about 0.9 m$^3$. Nuclear magnetic resonance (NMR) has become an increasingly powerful and convenient tool for both medical diagnostics and for medical research. The use of NMR solves the problems attending many applications where it is desirable that large areas of a patient's body be subjected to scanning more or less simultaneously without the movement of either the patient or of large pieces of equipment, either or both of which could easily cause distortion of the discernible indicia being studied. Towards accomplishing the desired goal of making available large areas of the body for scanning without the movement of either the patient or the equipment, fairly large uniform magnetic fields over body-sized volumes had to be effected. A uniform field of magnetic flux in the order of 1.5 kOe has been found sufficient to accommodate the average human body and to suitably fill the volume in which it is contained for diagnostic procedures. It is also desirable for reasons of safety and convenience in many medical diagnostic and experimental procedures to effect the tests or studies without the application of electrical fields. Of the three basic types of purely magnetic systems (resistive, permanent magnet, and superconductive), studies indicate that the permanent magnet type yields the best magnetic field/cost ratio in the relatively low field (1.5–3.0 kOe) regime. Ferrite permanent magnet type NMR diagnostic devices have been constructed and, while found to be suitable for the intended use within a reasonable degree, have been disadvantaged by the heavy weight of the large magnets required to generate the requisite fields over working volumes approximating the size of the human body.

The utilization of ferrite permanent magnets for the construction of nuclear resonance diagnostic devices is also, consequently, quite expensive due to the necessity for increased support structures, movement and installation, rigging costs and the like before the devices can be put into effective utilization.

In several earlier inventions, notably, U.S. Pat. No. 4,654,618, Mar. 31, 1987 and, U.S. Pat. No. 4,658,228, Apr. 14, 1987, the utilization of rare earth permanent magnetic materials for the effective containment and control without any substantial loss of field flux of electron beams in miniaturized magnetic devices in communications circuits and the like is taught. The '228 patent discusses the confinement of longitudinal axially symmetric magnetic fields and confining these fields with great precision to annular regions within permanent magnet structures. The '618 patent teaches the confinement of magnetic fields to very small areas in miniature devices. Both of these teach the basic concept of using particularly formed and especially shaped tapering in thickness from the ends of the structures to the centers thereof cladding magnets and the use of rare earth compound materials as effective magnetic substitutes for straight ferrites.

The basic teachings concerning the methods by which rare earth materials are put into place in magnetic elements and devices and which are described in detail in the two aforementioned patents, are incorporated by reference as teachings in this disclosure.

With this then being the state of the art, we conceived and developed the present invention to provide for effective NMR diagnostic procedures on relatively large target areas or zones approximating the size of the human body and, particularly, to do this with less bulky and lighter materials than heretofore used in devices of this type.

It is, therefore, a primary object of the present invention to provide an apparatus which may be used for NMR diagnosis of the human body in a particular zone by means of a surrounding rare earth magnetic device particularly constructed so as to align the field flux and effect the passage of same through the target body in a preselected desired manner.

It is a further object of this invention to provide such NMR diagnostic apparatus without the employment of large, bulky, and heavy ferrite devices heretofore used and with the consequent and attendant large structures and supports associated with these devices.

It is further an important object of the invention to provide for the NMR diagnostic procedures on the human body without the employment of electromagnetic fields such as would occur when solenoids, thyratrons, solid state devices, and the like radiation producing elements would be used in heretofore commonly known and available diagnostic machinery.

These and other object, features, and details of the invention will become the more readily understandable in the light of the ensuing detailed disclosure, particularly in the light of the drawings wherein.

SUMMARY OF THE INVENTION

In general, the invention comprehends a rare earth magnetic material device for nuclear magnetic resonance diagnostic procedures comprising, in combination, a longitudinally extending flux oriented rare earths peripheral magnet element encompassing a diagnostic target zone or work space which conforms generally to the shape and size of a preselected diagnostic target, the human body for instance; rare earths cladding magnet means coextending longitudinally with and disposed generally around the peripheral magnet which encloses the target zone, the cladding magnet having a flux field which is substantially normal to the flux field of the peripheral magnet and which diminishes in thickness from its outer ends towards and to its longitudinal midpoint where the thickness is approximately zero; and bucking magnets arranged and disposed at each end of the assembly to effectively contain and direct the orientation of the main field magnetic flux as well as the cladding field magnetic flux.

In one embodiment of our invention, a cylindrically formed main magnetic element is used to define the diagnostic target space and the cladding magnet is likewise a concentrically disposed cylindrical magnet which surrounds the basic target defining magnet. Bucking magnets are annular in shape and are provided at each end of the structure. A body or subject is introduced and removed into the work space through either open end.

Figure 3:
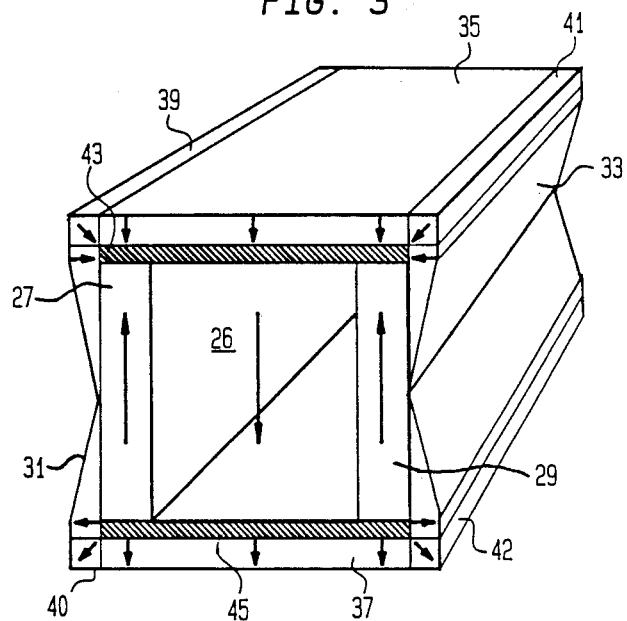
FIG. 3 is a perspective view of a cladded rectangular cross-section embodiment of apparatus according to our invention wherein the flux field is a transverse field.

In an alternative embodiment of apparatus according to our invention we provide a longitudinally extending rectangular or square cross-sectioned main target defining magnet as shown in FIG. 3 of the drawing. This embodiment is provided with longitudinally extending cladding magnets which have their diminishing points midway through the relative height of the structure. It is in any case, not necessary to completely surround the body with the cladding magnet device except in the case of the cylindrical version where it has been found that most effective flux control depends upon the utilization of this arrangement. In general, it is only necessary to arrange the cladding magnets in the configuration which will produce the necessary orientation and restraint of the main field flux.

DETAILED DESCRIPTION OF THE INVENTION

Figure 1:
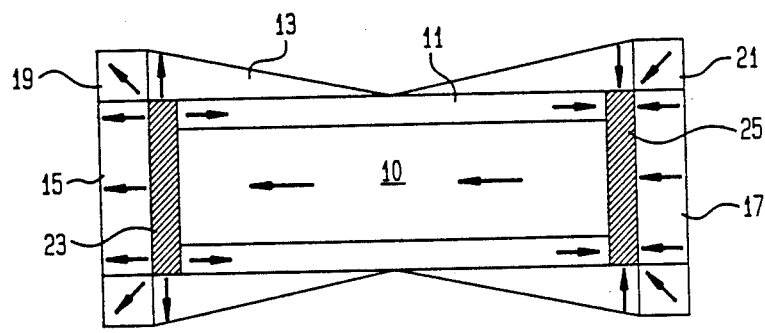
FIG. 1 is a cross-sectional view through an embodiment of apparatus according to our invention utilizing a cylindrical main form.

Referring to FIG. 1 of the drawing, we first describe an embodiment of apparatus according to our invention wherein the structure, generally in the shape of an elongate cylinder, comprises a longitudinally extending annular magnet 11, shown in longitudinal cross-section, a cladding magnet 13 disposed coaxially around and coextending longitudinally with annular magnet 11, bucking magnets 19,21, and pole pieces 23,25 arranged and disposed at the respective ends of the structure as shown in FIG. 1.

In order to provide the flux field of $$H = 1.5 \text{ kOe}$$

in a cylindrical work space 10 of a radius (R) of 40 centimeters and a length (L) of 180 centimeters, needed for medical diagnostics, a flux of $$\Phi_w = \pi R_w^2 H_w = 7540 \text{ kMx}$$

is required,
where
  $H_w$ = the field in kiloOersteds
  $R_w$ = the radius of the work space
  $L_w$ = the length of the work space
  $\Phi_w$ = workspace flux in kiloMaxwells The required flux of $754\phi$kMx is provided by annular magnet 11 encompassing the working space 10, as shown in FIG. 1.

The field $H_w$ in the working space must therefore be equalled by the field $H_m$ in the magnet 11. For the square-looped magnetic material used, the internal induction of magnet 11 is given by $$B_m = H_m + B_r = -1.5 \text{ kG} + 10 \text{ kG} = 8.5 \text{ kG}$$

where
  $B_m$ = the induction in kiloGauss
  $B_r$ = assumed remanence in kiloGauss The magnet 11 must supply a flux, as shown above, of 7540 kMx where
  $\Phi$ = magnet flux in kiloMaxwells The flux, 7540 kMx, is also the product of the cross-sectional area of the magnet producing the flux and that magnet's internal induction $B_m$, so that $$B_m A_m = 7540 \text{ kMx}$$

where
  $A_m$ = the cross sectional area of the magnet

Thus the annular cross sectional area of magnet 11 = 888 cm$^2$. From the geometric relationship $$A_m = \pi(R_o^2 - R_w^2)$$

and knowing that $A_m = 888$ cm$^2$ and $R_w = 40$ centimeters (above), the outer radius of the annular magnet 11, which equals the inner radius of the cladding magnet 13, is calculated as $R_o = 43.4$ cm.

To keep the flux confined to the work space 10, a tapered, radially (flux) oriented cladding magnet 13, encasing the annular magnet 11, as shown in FIG. 1, is required.

The maximum thickness $t_r$ of cladding magnet 13 is given by $$t_r = H_w L_w / 2 B_r = 13.5 \text{ cm}.$$

Bucking magnets 15,17, which, together with pole pieces 23,25, and ring-shaped corner magnets 19,21, prevent end losses by directionally confining flux are dimensioned as follows: The thickness, $t_b$, of the bucking magnets must equal $t_r$, the maximum thickness of the cladding magnet 11. Thus, $$t_b = t_r = 13.5 \text{ cm}$$

Pole pieces 23,25 must be sufficiently thick and sized to carry 7540 kMx of flux. Iron, for instance, having a saturation induction of 20 kG may be used, in which case the circumferential area $A_p$ of each disc is given by $$A_p = 7540 \text{ kMx} / 20 \text{ kG} = 377 \text{ cm}^2$$

from which thickness, $t_p$, computes $$t_p = A_p / 2\pi R_o = 1.38 \text{ cm}.$$

The total mass of this structure when samarium cobalt 17 ($Sm_2Co_{17}$), with a density $P = 8.3$ gm/cm$^3$, is approximately 7.59 tons (7.71 metric tons).

Figure 2:
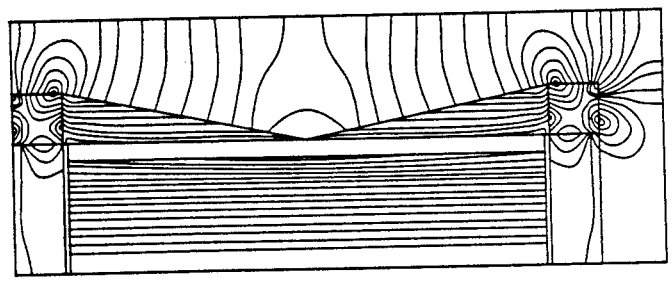
FIG. 2 is a two-dimensional finite element flux plot of the upper half of the device of FIG. 1 showing the general configuration of the relative flux fields and their interaction as provided by the elements of the device.

FIG. 2 of the drawing shows a two-dimensional finite element plot of the fields produced, and their orientation, of the upper half of the apparatus according to our invention hereinabove described and shown in FIG. 1. This diagram clearly reveals the pattern of the magnetic field produced by magnetic orientation of the apparatus of FIG. 1. As evident from the diagram, field uniformity over the central region of the structure is very good. FIG. 3 of the drawing illustrates apparatus according to my invention to produce a rectangular transverse field of 1.5 kOe over a working volume of about 0.9 m³. The overall dimensions of the structure shown would be 180 cm in length by 100 cm in width and 50 cm in height, these being the dimensions of the target area or working space 26.

To produce the required field of 1.5 kOe a flux of $$\Phi = (180 \; cm \div 100 \; cm)(1.5 \; kOe) = 27,000 \; kMx$$

As in the embodiment first described hereinabove, the internal field of the magnet must equal $-1.5$ kOe so that if a $B_r$ of 10 kG, is used, the internal induction will be $$B_m = 8.5 \; kG$$

and the cross-sectional area $A_m$ of the magnet is $$A_m = \Phi_w / B_w = 3176 \; cm^2.$$

The maximum size t of the transversely disposed cladding magnets 31, 33, is computed according to the essential relationship that at its outer surface, the cladding magnets must just cancel the magnetomotive force of the flux produced by the main magnets 27, 29. Therefore $$B_r t = -H_m L/2 \; or$$

$$t = |H_m L/2 \; B_r| = 3.75 \; cm.$$

The rectangular shaped pole pieces 43, 45 are aligned parallel to each other and bridge the ends of the rectangular shaped flux carrying magnets 27, 29 which are aligned parallel to and separated from each other a given distance. The pole pieces must carry 27,000 kMx at their sections that are coplanar with the inside forces of the supply magnets. The pole piece thicknesses, may then be computed as $$t_p = (27,000 \; kMx/2LB_s) = 3.75 \; cm$$

where $B_s$, the saturation induction of iron, is 20 kG.

The top and bottom of bucking magnets 35, 37 cladding the pole pieces must be of the same thickness, that is to say $t = 3.75$ cm, as those cladding the flux carrying magnets 27,29. Magnets 39, 40, 41 and 42 are interposed between each cladding magnet and bucking magnet, respectively.

Figure 4:
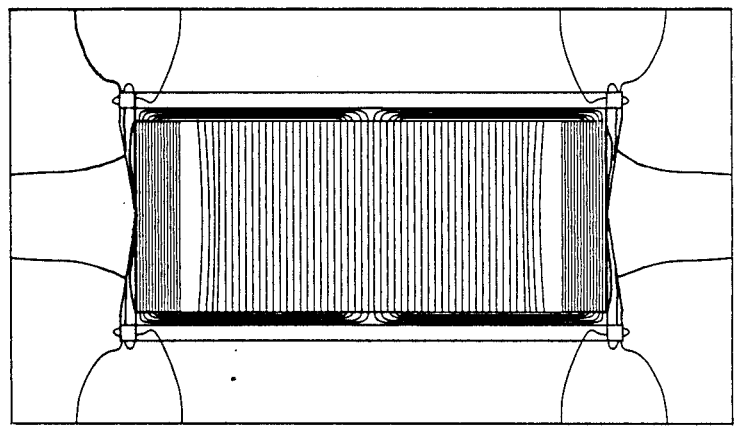
FIG. 4 is a two-dimensional finite element flux plot of the device shown in FIG. 3.

Together, all of ,these components weigh a total of approximately 4.6 tons (4.67 metric tons) and produce a two-dimensional flux plot as shown in FIG. 4 of the drawing.

Analysis and some experimentation has shown that in each of the above-described embodiments there is some amount of field uniformity degradation near the walls of apparatus enclosing the work space due to less than perfect cladding. All-in-all, however, the total design effects a uniformly controlled flux of sufficient accuracy, and made with significantly lighter materials and structures than heretofore provided for this sort of work, a completely useful and greatly advanced instrument for use in diagnostic medical imaging, and this, it is important to note, without the utilization of electromagnetics or any current carrying devices.

PREFERRED EMBODIMENT

While either of the above-described embodiments are completely suitable for the intended task, i.e. medical diagnostic imaging, the second-described embodiment or the rectangular version would be the preferred embodiment of apparatus according to the invention, due mainly to the fact of its lower weight.

In the light of the foregoing disclosure, it is conceivable that numerous alternative embodiments of apparatus according to our invention will occur to those skilled in the art. It should be noted here, therefore, that the foregoing description is intended to be illustriative only and should not be construed in any limiting sense, it being our intention to define our invention by the appended claims.

What is claimed is:

1. A magnetic device for nuclear magnetic resonance diagnostics comprising, in combination:
    a longitudinally extending magnet element comprising a pair of flux carrying magnets made of a compound containing one or more rare earth elements, said pair of magnets aligned parallel to and separated from each other a given distance, and a pair of pole pieces aligned parallel to each other and bridging the edges of said pair of flux carrying magnets, said pair of magnets and said pair of pole pieces forming a diagnostic workspace conforming generally to the size and shape of the human body, a magnetic field being generated by said magnet element, said magnetic field extending transversely through said workspace;
    cladding magnet means for confining said magnetic field in said workspace, said cladding magnet means coextending longitudinally with said longitudinally extending magnet element, disposed and arranged in lateral relation thereto and having a magnetization substantially normal to the magnetic field of said longitudinally extending magnet element thereby confining said magnetic field in said workspace;
    bucking magnets arranged and mounted, coextensive with each pole piece, each bucking magnet having a magnetization directed parallel to the magnetic field produced by the longitudinally extending magnet element.

2. A magnetic device as defined in claim 1 wherein said magnet element has a rectangular cross-section.

3. A magnetic device as defined in claim 2 wherein said pair of flux carrying magnets are rectangular and said pair of pole pieces are rectangular.

4. A magnet device as defined in claim 3 wherein said transversely extending magnetic field extends from one pole piece to the other.

5. A magnetic device as defined in claim 4 comprising magnets interposed between each cladding magnet and each bucking magnet.

* * * * *